(12) United States Patent
Xiong et al.

(10) Patent No.: US 7,718,574 B2
(45) Date of Patent: May 18, 2010

(54) BIAXIALLY-TEXTURED FILM DEPOSITION FOR SUPERCONDUCTOR COATED TAPES

(75) Inventors: Xuming Xiong, Niskayuna, NY (US); Venkat Selvamanickam, Wynantskill, NY (US)

(73) Assignee: SuperPower, Inc., Schenectady, NY (US)

(*) Notice: Subject to any disclaimer, the term of this patent is extended or adjusted under 35 U.S.C. 154(b) by 1774 days.

(21) Appl. No.: 10/821,010

(22) Filed: Apr. 8, 2004

(65) Prior Publication Data

US 2005/0239659 A1  Oct. 27, 2005

(51) Int. Cl.
*H01L 39/00* (2006.01)
*H01B 12/00* (2006.01)
*B05D 5/12* (2006.01)

(52) U.S. Cl. .................. 505/300; 505/430; 505/473; 505/730; 428/701; 428/702; 428/698; 428/930; 204/192.1; 204/192.24; 427/595; 427/596; 427/62

(58) Field of Classification Search .............. 505/230, 505/325, 400, 430, 434, 470, 480, 490, 500; 427/8–10, 62, 523–534, 595–596; 438/510; 174/125.1; 29/599; 428/701–702, 930
See application file for complete search history.

(56) References Cited

U.S. PATENT DOCUMENTS

| | | | |
|---|---|---|---|
| 6,361,598 B1 | 3/2002 | Balachandran et al. | |
| 6,537,689 B2 | 3/2003 | Schoop et al. | |
| 6,809,066 B2 * | 10/2004 | Reade et al. | 505/411 |
| 6,821,338 B2 * | 11/2004 | Reade et al. | 117/4 |
| 6,899,928 B1 * | 5/2005 | Groves et al. | 427/529 |
| 2004/0168636 A1 * | 9/2004 | Savvides et al. | 118/723 CB |

FOREIGN PATENT DOCUMENTS

WO    WO 02-095084    * 11/2002

OTHER PUBLICATIONS

Y. Iijima, et al., "In-Plane Aligned YBa2Cu3O7-x Thin Films Deposited on Polycrystalline Metallic Substrates", Appl. Phys. Letters, vol. 60, pp. 769-771, 1992.
X. Wu, et al., "Properties of YBa2Cu3O7-s Thick Films on Flexible Buffered Metallic Substrates", Appl. Phys. Letters, vol. 67, No. 16, pp. 2397-2399, 1995.

(Continued)

*Primary Examiner*—Stanley Silverman
*Assistant Examiner*—Kallambella Vijayakumar
(74) *Attorney, Agent, or Firm*—Larson Newman & Abel, LLP

(57) ABSTRACT

Methods for depositing, at a very high deposition rate, a biaxially-textured film on a continuously moving metal tape substrate are disclosed. These methods comprise: depositing a film on the substrate with a deposition flux having an oblique incident angle of about 5° to about 80° from the substrate normal, while simultaneously bombarding the deposited film using an ion beam at an ion beam incident angle arranged along either a best ion texture direction of the film or along a second best ion texture direction of the film, thereby forming the biaxially-textured film, wherein a deposition flux incident plane is arranged parallel to a direction along which the biaxially-textured film has a fast in-plane growth rate. Superconducting articles comprising a substrate, a biaxially-textured film deposited on said substrate by said methods above; and a superconducting layer disposed on the biaxially-textured film are also disclosed.

87 Claims, 6 Drawing Sheets

OTHER PUBLICATIONS

H. Freyhardt, et al., "YBaCuO Thick Films on Planar and Curved Technical Substrates", vol. 7, No. 2, pp. 1426-1431, 1997.

R. Huehne, et al., "Growth of Biaxial Textured MgO-Layers by Ion-Beam Assisted Pulsed Laser Deposition", Crystal Res. Technology, vol. 35, No. 4, pp. 419-425, 2000.

L. Dong, et al., "Texture Development Mechanisms in Ion Beam Assisted Deposition", Journal of Applied Physics, vol. 84, No. 9, pp. 5261-5269, 1998.

J. Groves, et al., Recent Progress in Continuously Processes IBAD MgO Template Meters for HTS Applications, Physica C 382, pp. 43-47, 2002.

Hasegawa, K. et al., Proc. of 16$^{th}$ ICEC/ICMC Proceedings, Amsterdam: Elsevier Science pp. 1413-1416. (1997).

Dimos, D. et al., *Orientation Dependence of Grain Boundary Critical Currents in $YBa_2Cu_3O_{7-\delta}$ Bicrystals*, The American Physical Society, Physical Review Letters, vol. 61, #2, pp. 219-222, (Jul. 11, 1988).

Dimos, D. et al., *Superconducting Transport Properties of Grain Boundaries in $YBa_2Cu_3O_{7-\delta}$ Bicrystals*, The American Physical Society, Physical Review Letters, vol. 41, #7, pp. 4038-4049, (Mar. 1, 1990).

Groves, James R.; et al., *Development of the IBAD MgO Process for HTS Coated Conductors*, 2001 International Workshop on Superconductivity, Honolulu, HI, Jun. 24-27, 2001.

Bauer, M., et al., *YBCO Films on Metal Substrates with Biaxially Aligned MgO Buffer Layers*, IEEE Transactions on Applied Superconductivity, vol. 9, No. 2, pp. 1502-1505, (Jun. 1999).

Foltyn, Stephen R., et al., *High-$T_c$ Coated Conductors—Performance of Meter-Long YBCO/IBAD Flexible Tapes*, IEEE Transactions on Applied Superconductivity, vol. 9, No. 2, pp. 1519-1522 (Jun. 1999).

Xiong, Xuming, et al., *Rapid Deposition of Biaxially-textured CeO2 Buffer Layers on Polycrystalline Nickel Alloy for Superconducting Tapes by Ion Assisted Pulsed Laser Deposition*, Physica C, 336 (2000) pp. 70-74.

Reade, R. P., *Ion-Beam Nanotexturing of Buffer Layers for Near-Single-Crystal Thin-Film Deposition: Application to $YBa_2Cu_3O_{7-\delta}$ Superconducting Films*, Applied. Phys. Letter, vol. 80, No. 8, pp. 1352-1354 (2002).

\* cited by examiner

BIAXIALLY-TEXTURED FILM DEPOSITION FOR SUPERCONDUCTOR COATED TAPES

BACKGROUND OF THE INVENTION

1) Field of the Invention

The present invention relates generally to the field of second-generation superconductors. More specifically, it relates to a process for depositing, at a very high rate, a biaxially-textured film on a continuously moving metal substrate tape. Even more specifically, it relates to a process wherein a film is deposited on a substrate with a deposition flux having an oblique incident angle, while simultaneously being bombarded by an ion beam at an ion beam incident angle arranged along either a best ion texture direction (BITD) or a second best ion texture direction of said film, thereby forming a biaxially-textured film, wherein the deposition flux incident plane is arranged parallel to the direction along which the biaxially-textured film has a fast in-plane growth rate.

2) Prior Art

Second-generation superconducting tapes, such as those based on $Y_1Ba_2Cu_3O_{7-\delta}$ (YBCO) films, are being developed to carry large amounts of electrical current without electrical resistance. Such second-generation, high temperature superconductors (HTS) typically comprise biaxially-textured (narrow out-of-plane and in-plane grain orientation distributions) layers deposited on a metal substrate, such as a flexible metal tape. It is known that the biaxially-textured layer enables high current densities ($J_c$) in YBCO films, among others.

The effects of grain boundary characteristics on current transmission have been demonstrated for YBCO films (Dimos et al. (1988) Phys. Rev. Lett. 61:219; and Dimos et al. (1990) Phys. Rev. Lett. 41:4038). For clean, stoichiometric boundaries, critical current density appears to be determined primarily by grain boundary misorientation.

Several attempts have been made to grow sharply textured YBCO films having high critical current densities on flexible metal tapes. In one approach, a biaxially-textured layer was deposited using ion beam assisted deposition (IBAD) on a Ni-based alloy tape, such as Hastelloy® (S. R. Foyltn et al., IEEI Transactions on Applied Superconductivity 9 (1999) pp. 1519). The IBAD of a buffer layer of yttria-stabilized zirconia (YSZ) was the first demonstrated process to achieve biaxially-textured layers, and has produced several of the longest and best performing YBCO superconductors. It is generally accepted that texture development in IBAD-YSZ is based on a growth competition mechanism. As a result, one disadvantage of this method is that thick layers must be grown in order to achieve good in-plane texture. Typically, biaxially-textured layers that are more than about 1,000 nm thick achieve in-plane textures of less than 15° full-width-at-half-maximum (FWHM). This problem is further exacerbated by the very low deposition rate (about 0.1 nm per second) needed to grow high quality IBAD-YSZ. The combination of thick films and low deposition rates necessitates long deposition times (typically hours) to grow a biaxially-textured layer with a thickness greater than about 1,000 nm. Therefore, this process may not be suitable for rapid, large-scale industrial applications.

IBAD of magnesium oxide (MgO) has been used to achieve very good biaxial texture in films about 10 nm thick using a deposition rate of about 0.1 nm/second (J. R. Groves et al., Proc. 2001 Intl. Workshop on Superconductivity, Honolulu, Hi. (Jun. 24-27, 2001), p. 3). This IBAD-MgO process, as such, could be about 100 times faster than IBAD-YSZ. However, this IBAD-MgO method requires at least three additional layers in the buffer structure; the first is an amorphous seed layer, the second is a thick homo-epitaxially grown MgO layer, and the third is yet another layer for better lattice matching with YBCO. By requiring three additional layers, additional time and effort are needed to process the buffer structure in IBAD-MgO. Furthermore, the biaxial texture of MgO is very sensitive to the roughness of the underlying substrate, as well as other factors. Therefore, it may be difficult to achieve high yields in the manufacture of IBAD-MgO-based layers.

Inclined substrate deposition (ISD) without the assistance of ion beam bombardment has been shown to achieve high deposition rates (K. Hasegawa et al, Proc. of $16^{th}$ ICEC/ICMC, Amsterdam: Elsevier Science (1997), p. 1077; and M. Bauer et al. IEEE Transactions on Applied Superconductivity 9 (1999) p. 1502). These high deposition rates can minimize the time needed for coating long wires. However, the quality of film produced by ISD is poor compared to the quality produced using IBAD, and the c-axis in these ISD layers is tilted off surface normal. This makes the critical current density ($J_c$) anisotropic, and the critical current decreases greatly along the tilt direction. The films deposited by this ISD method tend to have a rough surface with a pattern similar to "roofing tiles."

In an additional approach, ion beam nanotexturing (ITEX) of YSZ has been shown to produce biaxially-textured YSZ in a matter of a few minutes (R. P. Reade et al., Applied Physics Letters, Vol. 80, No. 8 (2002) p. 1352). ITEX is similar to IBAD, except that in the ITEX method, an amorphous YSZ layer is first deposited, then an oblique ion (Ar+) beam at an angle of about 55° is used to bombard the amorphous film with $O_2$ in a chamber. The result is a crystalline texture in the top surface of the amorphous layer. This method is very rapid, but results in a very poor in-plane texture of about 45°. An in-plane texture of about 15° or less is necessary in order to achieve good properties in the YBCO layer when deposited upon the biaxially-textured layer.

Fast ion beam assisted deposition of cerium oxide ($CeO_2$) biaxially-textured layers (Fast IBAD) has been shown to achieve much higher deposition rates than IBAD-YSZ (X. Xiong et al., "Rapid Deposition of Biaxially-Textured $CeO_2$ Buffer Layers on Polycrystalline Nickel Alloy for Superconducting Tapes by Ion Assisted Pulsed Laser Deposition", Physica C, 336 (2000) 70). In fast IBAD, the deposition rate is similar to the ISD method, but fast IBAD results in a better film quality, and the c-axis (z-axis) is not tilted off normal in the fast IBAD conductors as it is in the ISD-based conductors. However, the $J_c$ obtained by this fast IBAD method is not as good as that of IBAD-YSZ. The texture of the biaxially-textured layer, especially the texture of YBCO deposited via fast IBAD, requires further improvement.

Thus, there is a need in the art for novel and robust processes for depositing, at a very high deposition rate, a biaxially-textured film on a continuously moving metal tape. Such processes should increase the deposition rate by at least ten times the conventional deposition rate of IBAD-YSZ of about 0.1 nm/second, resulting in a deposition rate of about 1.0 nm/second or greater. Such processes should substantially reduce production times. Such processes should result in grain alignment on a large-scale basis. Such processes should be used to develop manufacturing facilities for producing kilometer lengths of HTS-coated conductors at price and performance levels needed for numerous applications. Such processes should result in a high population of low-angle grain boundaries.

SUMMARY OF THE INVENTION

To achieve the foregoing and other objects, and in accordance with the purposes of the present invention, as embodied and broadly described herein, the present invention provides processing methods for second-generation, high temperature superconductors. In various embodiments, the present invention provides methods for depositing, at a very high deposition rate, a biaxially-textured film on a continuously moving metal tape.

In the broadest sense, this invention comprises a method for depositing a biaxially-textured film on a substrate, comprising:

depositing (directly or indirectly) a film on a substrate (such as a metal tape) with a deposition flux at an oblique incident angle, while simultaneously bombarding the deposited film using an ion beam at an ion beam incident angle arranged along either a best ion texture direction (BITD), or a second best ion texture direction of the film, thereby forming a biaxially textured film, wherein a deposition flux incident plane is arranged parallel to a direction along which the biaxially-textured film has the fastest in-plane growth rate.

In the broadest sense, this invention comprises a method for depositing a biaxially-textured film on a substrate, comprising either:

depositing a film of material with strong anisotropic growth rate on a substrate with a deposition flux at an oblique incident angle, while an assisting ion beam may be used to bombard the deposited film simultaneously during deposition thereby forming a biaxially-textured film, or depositing a film of material with strong anisotropic growth rate on a substrate with a deposition flux along substrate normal, while simultaneously bombarding the deposited film using an oblique angle ion beam, thereby forming a biaxially-textured film, wherein the biaxially-textured film comprises a non-cubic layer-structured material with strong anisotropic growth rate between the c axis and the a-b plane, the growth rate along the a-b plane is much higher than along the c-axis.

In the broadest sense, the present invention also comprises: a high-temperature superconductor article, comprising: a substrate, such as a metal tape; biaxially-textured film deposited on the substrate by the methods mentioned in above paragraph; and a superconducting layer disposed on the biaxially-textured film.

Further features, aspects and advantages of the present invention will be more readily apparent to those skilled in the art during the course of the following description, wherein references are made to the accompanying figures which illustrate some preferred forms of the present invention, and wherein like characters of reference designate like parts throughout the drawings.

BRIEF DESCRIPTION OF THE DRAWINGS

The systems and methods of the present invention are described herein with reference to various figures, in which.

DETAILED DESCRIPTION OF THE INVENTION

Figure 1:
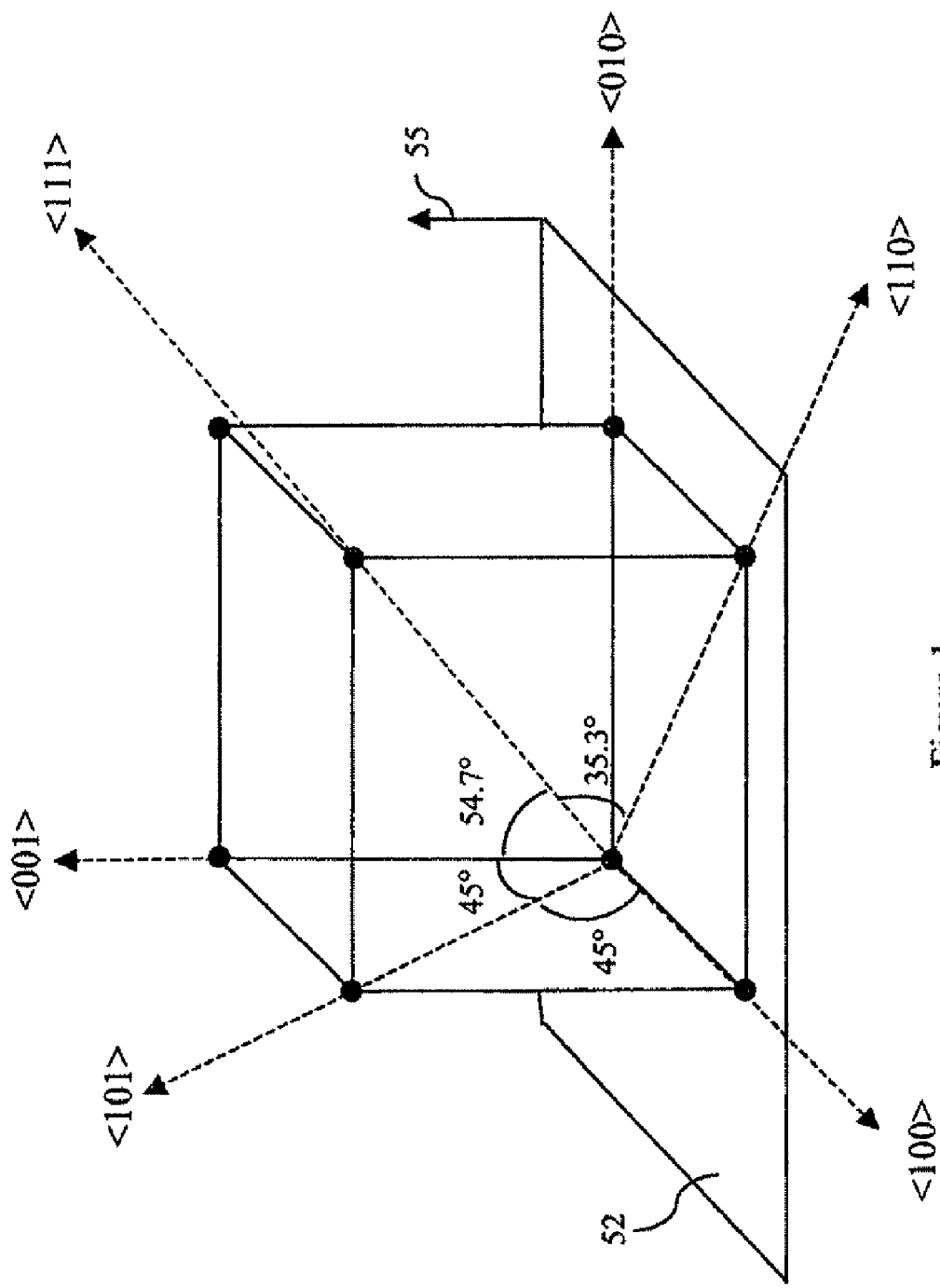
FIG. 1 is an illustration showing the crystallographic directions of a fluorite type material, a pyrochlore type material, a rare earth C type material, a $ReO_3$ type material (where Re is rhenium), a perovskite type material, or a rock salt type material.

For the purposes of promoting an understanding of the invention, reference will now be made to some preferred embodiments of the present invention as illustrated in FIGS. 1-10 and specific language used to describe the same. The terminology used herein is for the purpose of description, not limitation. Specific structural and functional details disclosed herein are not to be interpreted as limiting, but merely as a basis for the claims as a representative basis for teaching one skilled in the art to variously employ the present invention. Any modifications or variations in the depicted structures and methods of making same, and such further applications of the principles of the invention as illustrated herein, as would normally occur to one skilled in the art, are considered to be within the spirit of this invention.

The present invention describes methods for deposition of high quality biaxially-textured films as a buffer layer for second-generation high temperature superconducting tapes having a high critical current density. As used herein, the critical current density refers to a measurement of current carrying capacity, and is abbreviated $J_c$, measured in amperes/ square centimeter ($A/cm^2$ at 0 T and 77K). As is known in the art, the critical current density in oxide films is partly dependent upon grain-to-grain misalignments. Higher $J_c$ values are associated with smaller misalignment angles. Devices utilizing the present invention require good control over the grain alignment of the materials therein. Frequent high-angle boundaries impede current flow. The high-temperature superconductors produced using the methods described below have very high critical current densities.

As also used herein, "substrate normal" is the direction perpendicular to the substrate surface plane; the "deposition flux incident plane" is the plane defined by substrate normal and the direction of the deposition flux; and the "ion beam incident plane" is the plane defined by substrate normal and the direction of ion beam.

In order to create low-angle grain boundaries in a material, it is necessary to create a biaxial texture in the material. A biaxially-textured film, by definition, has both an in-plane and out-of-plane crystal texture. A biaxially-textured film is defined herein as a polycrystalline material in which both the crystallographic in-plane and out-of-plane grain-to-grain misorientation of the surface is less than about 30°, such as less than about 20°, 15°, 10°, or 5°, but generally greater than about 1°. The degree of biaxial texture can be described by specifying the distribution of grain in-plane and out-of-plane orientations as determined by x-ray diffraction. A full-width-half-maximum (FWHM) of the rocking curve of the out-of-plane ($\Delta\omega$) and in-plane ($\Delta\phi$) reflection can be determined. Therefore, the degree of biaxial texture can be defined by specifying the range of $\Delta\omega$ and $\Delta\phi$ for a given sample. Preferably the ($\Delta\phi$) can be less than about 15° and ($\Delta\omega$) can be less than about 10° for sharply textured layers.

The present invention describes methods for increasing the deposition rates of biaxially-textured films over the deposition rates of conventional IBAD-YSZ methods. Typically, conventional IBAD-YSZ deposition is performed at a rate of about 0.1 nm/second in order to obtain a sharply textured layer. The deposition rates for sharply textured layers of the present invention are about 1 nm/second or greater, preferably greater than about 2.0 nm/second, and more preferably greater than about 3.0 nm/second. The result is a rate increase of about thirty times that of conventional methods, which is useful for large-scale fabrication of superconducting tapes.

In conventional IBAD methods, the deposition flux is oriented normal to the film surface. In this invention, the deposition flux has an oblique incident angle to the film surface, which helps achieve faster texture evolution and results in a better film texture. Furthermore, in this invention, the ion beam bombardment occurs at a certain incident angle to the film surface.

In conventional ISD methods, the deposition flux has an oblique incident angle to the film surface, but the <001> axis in the ISD layers is tilted off film normal, resulting in undesired out-of-plane orientation, and a rough film surface similar to "roofing tiles." In this invention, the deposition rate is similar to or faster than that of conventional ISD methods, but the <001> axis of the biaxially-textured buffer layers of this invention does not tilt off film normal, and more, the anisotropic growth rate induced by ion bombardment in this invention helps to achieve a better texture. Ion beam bombardment in this invention also increases the atomic mobility in the film surface and helps to obtain a denser, smoother film.

It is well known that in ion beam assisted deposition (IBAD), when an ion beam bombards a growing film at a specific angle, which usually relates to one of the film's low index crystallographic directions such as <111>, <110>, or <100>, the sharpest biaxial texture is obtained at this incident angle because ion beams incident along this direction have a channeling effect and/or cause the least damage to growing films. This incident angle is called the best ion texture direction (BITD), and the angle may change with different materials and/or with different deposition parameters like the ion-to-atom arrival ratio. In this invention, the ion beam incident angle is arranged so that it is along the BITD while, at the same time, the deposition flux incident plane is parallel to the direction along which the buffer film has a fast in-plane growth rate. Depending on the material, the range for the deposition flux incident angle is from about 5° to about 80° from film normal. Depending on the material, the range for the ion beam incident angle is from 10-60° from film normal, or at glancing angle (near 0° from substrate surface), or substantially along the substrate normal (near 0° from substrate normal).

In this invention, the materials used for the biaxially-textured film(s) have a fast growth rate along one certain low index crystallographic direction, and a slow growth rate along the other crystallographic directions. It is well known that with ion beam assisted deposition, the sharpest biaxial texture is obtained when an ion beam bombards the growing film at a certain specific angle. In this invention, the ion beam incident angle is arranged so that it is along the direction producing the sharpest texture, while at the same time, the deposition flux incident plane is parallel to the direction along which the biaxially-textured film has a fast in-plane growth rate. The overlapping of the growth anisotropy introduced by the oblique deposition flux and the growth anisotropy introduced by ion bombardment yields a fast texture evolution rate.

In one exemplary embodiment, a high-rate evaporation method, such as electron beam evaporation (e-beam evaporation), is operable for providing the deposition flux. In the prior art method by X. Xiong et al. ("Rapid Deposition of Biaxially-Textured $CeO_2$ Buffer Layers on Polycrystalline Nickel Alloy for Superconducting Tapes by Ion Assisted Pulsed Laser Deposition", Physica C, 336 (2000) 70), the deposition flux was provided using excimer lasers. Excimer lasers are very expensive and are not cost-effective for large-scale production methods. In contrast, the high-rate evaporation method is cost effective and excellent for large-scale industrial applications.

Figure 2:
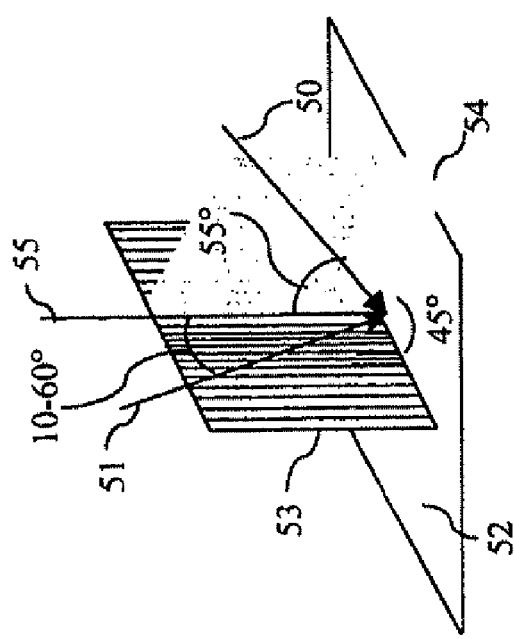
FIG. 2 is an illustration showing one configuration of the ion beam, the deposition flux, and the substrate for a fluorite type, a pyrochlore type, or a rare earth C type material.

Any suitable biaxially-textured film material may be used in the present invention, provided that the biaxially-textured film does not adversely react with the superconducting film or the substrate. In one embodiment of this invention, cubic-structured materials having a fast growth rate direction along the <100>, <001>, or <010> crystal axes are used for IBAD biaxially textured film deposition. Such materials include, but are not limited to, fluorite type materials such as cerium oxide ($CeO_2$), RE doped cerium oxide $(RECe)O_2$, where RE is samarium, europium, erbium, lanthanum, and yttria-stabilized zirconia (YSZ); pyrochlore type materials such as $Eu_2Zr_2O_7$ and $Gd_2Zr_2O_7$; and rare-earth C type materials such as yttrium oxide ($Y_2O_3$). FIG. 1 shows crystallographic directions of these kinds of materials. For these materials, and as further illustrated in FIG. 2, the film's out-of-plane orientation is along the <001> axis due to the fast growth rate along this axis, and the BITD should be along the <111> axis. Therefore, the ion beam 50 runs along the BITD (i.e., along the <111> axis) and is about 55° from the substrate and film normal 55, as shown in FIG. 2. Because the film's fast in-plane growth direction is along crystal axis <100>, and the deposition flux incident plane 53 is arranged parallel to this direction, the angle between the deposition flux incident plane 53 and the ion beam incident plane 54 is about 45° or about 135°, as illustrated in FIG. 2. In this configuration of the ion beam 50, the deposition flux 51, and the substrate 52, the deposition flux 51 has an oblique incident angle of about 5° to about 80°, preferably about 20° to about 55° from substrate normal 55. Configuring the ion beam 50, the deposition flux 51, and the substrate 52 in this manner results in the overlapping of the anisotropic growth introduced by the ion beam and the anisotropic growth introduced by the oblique deposition flux, which yields fast biaxial texture development. The ion-to-atom arrival ratio (I/A) for these cubic structured materials is from about 0.2 to about 3, and preferably from about 0.5 to about 1.0. The energy of the ion beam is about 150 eV to about 1500 eV. The deposition rate can be greater than about 1 nm/second, and preferably greater than about 3 nm/second. The thickness of the biaxially-textured film is above about 0.2 μm.

Figure 3:
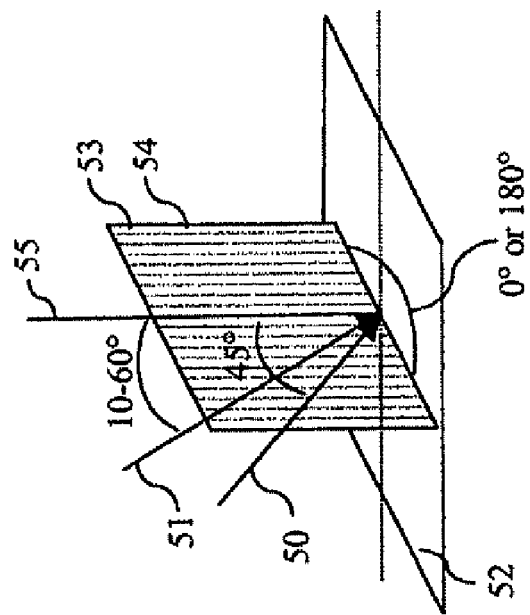
FIG. 3 is an illustration showing another configuration of the ion beam, the deposition flux, and the substrate for a fluorite type, a pyrochlore type, or a rare earth C type material.

Referring now to FIG. 3, there is shown an illustration showing another configuration of the ion beam 50, the deposition flux 51, and the substrate 52 for a fluorite type, a pyrochlore type, or a rare earth C type material as shown in FIG. 1. Such materials include, but are not limited to, fluorite type materials such as cerium oxide ($CeO_2$), RE doped cerium oxide $(RECe)O_2$, where RE is samarium, europium, erbium, lanthanum, and yttria-stabilized zirconia (YSZ); pyrochlore type materials such as $Eu_2Zr_2O_7$ and $Gd_2Zr_2O_7$; and rare-earth C type materials such as yttrium oxide ($Y_2O_3$). In this embodiment, the film's out-of-plane orientation is along the <001> axis due to the fast growth rate along <100>, <010> or <001>, same as in the embodiment described above, but with low ion-to-atom arrival ratio. At a low ion-to-atom arrival ratio less than about 0.5, the BITD or second best ion texture direction (second BITD) is along the <110> crystal axis. Therefore, in these embodiments, the ion beam incident angle 50 follows the <110> crystal axis, which is about 45° from substrate normal. In these embodiments, the deposition flux incident plane 53 is parallel to the film's fast in-plane growth direction <100>, or perpendicular to film's fast in-plane growth direction under some growth conditions, and the ion beam incident plane 54 is also parallel to the <100> axis, so the angle between the deposition flux incident plane 53 and the ion beam incident plane 54 is about 0° or about 180° as shown in FIG. 3, or about 90°. The ion beam incident angle is in the range of about 10° to about 60°, preferably about 45°, from the substrate normal 55. The deposition flux 51 has an incident angle in the range of 50 to 80°, preferably about 20° to about 55° from substrate normal 55. In this configuration, the ion-to-atom arrival ratio (I/A) needs to be less than about 0.5, preferably in the range between about 0.05 and about 0.3; and the ion energy is about 150 ev to about 1500 ev, preferably, from about 500 ev to about 900 ev. In this embodiment, the deposition rate can be greater than about 1 nm/second, preferably above about 3 nm/second. The thickness of the biaxially-textured film is above about 0.2 μm.

Figure 4:
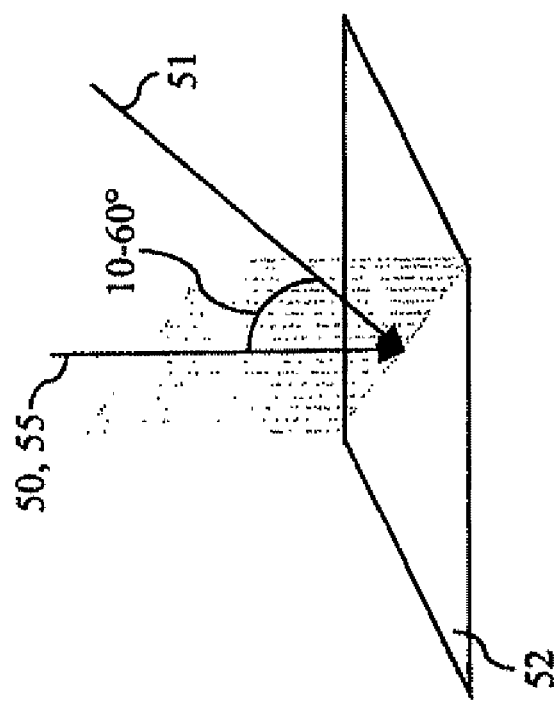
FIG. 4 is an illustration showing one configuration between the ion beam, the deposition flux, and the substrate for a rock salt type material, a $ReO_3$ type material, and perovskite type material.

In other embodiments, materials having a rock salt crystal structure such as MgO (magnesium oxide), BaO (barium oxide) or NiO (nickel oxide), or $ReO_3$ (rhenium trioxide) type structure such as $WO_3$ (tungsten trioxide) or, or perovskite structure such as $LaAlO_3$ (lanthanum aluminate) or $SrTiO_3$ (strontium titanate), are used for biaxially-textured film deposition. FIG. 1 also illustrates the crystallographic directions of this type of material. Compared to the fluorite type materials discussed above, materials with the rock salt crystal structure have larger anisotropic sputter yield/damage along different low index axis, which is good for texture formation by IBAD. However, in materials with the rock salt crystal structure, it is difficult to obtain <001> out-of-plane orientation under dynamic growth condition because the growth rates along the <111> and <110> axes are higher than along the <001> axis. Generally, the only way to get <001> out-of-plane orientation in these materials is to apply thermodynamic conditions (i.e., high temperatures). However, there is one special case where <001> out-of-plane orientation can be achieved at low temperature in these materials—during the initial nucleation stage. During the initial film growth of ionic crystals such as MgO or NiO, charge effect plays a dominating role during nucleation stage. The charge-balanced <001> plane of the MgO or NiO has the lowest energy to nucleate so the resulting film will have <001> out-of-plane orientation. As the film grows thicker, the importance of charge effect is reduced, and the film's out-of-plane orientation changes to the <111> or <110> axis, depending upon the deposition conditions. Therefore, the film growth needs to be stopped after a certain thickness in order to prevent this change in the out-of-plane orientation. This mechanism is used in IBAD MgO process. In this invention, because the fast growth direction for such materials is supposed to be along the <111> axis, and the BITD is supposed to be along the <100>, <001>, <010> axis, in order to obtain <001> out-of-plane orientation, as shown in FIG. 4, the ion beam 50 bombards the film 52 along the substrate normal 55 with ion energy of about 300 ev to about 1500 ev to force the film to have <001> out of plane orientation, while at same time, the deposition flux 51 has an oblique incident angle of about 5° to about 80° from substrate normal 55, preferably about 45 to about 65°, along the <111> direction. Because the ion beam 50 in this invention bombards the film along the substrate normal 55, the ion bombardment does not introduce in-plane anisotropic growth. The anisotropic growth here is solely introduced by the oblique incident angle of the deposition flux 51, as in the ISD method. However, unlike the ISD method, in this invention, the <001> axis is not tilted from substrate normal 55, but rather, it is substantially parallel to substrate normal 55. In this embodiment, the deposition rate can be greater than about 1 nm/second, preferably above about 3 nm/second.

Figure 5:
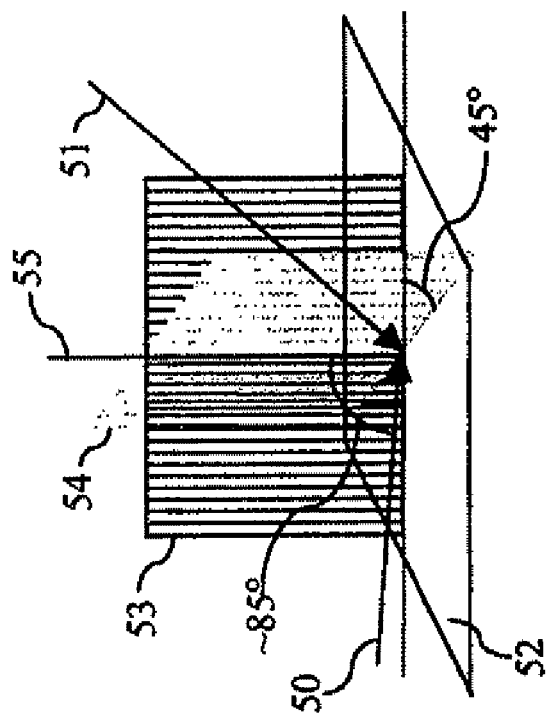
FIG. 5 is an illustration showing another configuration between the ion beam, the deposition flux, and the substrate for a rock salt type material, a $ReO_3$ type material, or perovskite type material.

In other embodiments of rock salt type materials, or $ReO_3$ type material, or perovskite type material, in order to introduce in-plane anisotropic growth by the oblique ion beam bombardment, as shown in FIG. 5, the ion beam 50 bombards the film 52 at a glancing angle (a few degrees from the film surface, typically around 5°), and the angle between the ion beam incident plane 54 and the deposition flux incident plane 53 is about 45° or about 135°. In this case, the ion beam 50 is roughly along the <010> direction, the <111> axis is within the deposition flux incident plane 53, and the deposition flux 51 has an oblique incident angle of about 5° to about 80° from substrate normal 55, preferably about 45 to about 65°, along the <111> direction. The ion energy is about 300 ev to about 1500 ev, preferably in the range between about 700 eV and about 900 eV. In the embodiment, the biaxially texture of the deposited film can be due to growth selection mechanism like in conventional IBAD YSZ or ISD MgO, or/and due to biaxial nucleation mechanism like in IBAD MgO. In this embodiment, unlike IBAD MgO, the film's out-of-plane orientation will not changes to the <111> or <110> axis when film grows thicker than about 10 nm, and sharper biaxial texture and higher yield of sharp texture is obtained compared with IBAD MgO process. Another advantage of this embodiment is that it does not put high demand on the substrate surface roughness, and also does not need additional homo-epitaxial layers.

In another embodiment of rock salt, $ReO_3$ or perovskite materials with fastest growth rate direction along crystal axis <111> and a best ion texture direction (BITD) or a second best ion texture direction along <110> crystal direction, the biaxially textured film is produced using an ion beam incident angle, which is about 45° from film normal, and using a deposition flux incident angle in the range between about 45° to about 65° from film normal. In this case, the ion-to-atom arrival ratio (I/A) is from about 0.2 to about 3, preferably between about 0.5 and about 1.

Figure 7:
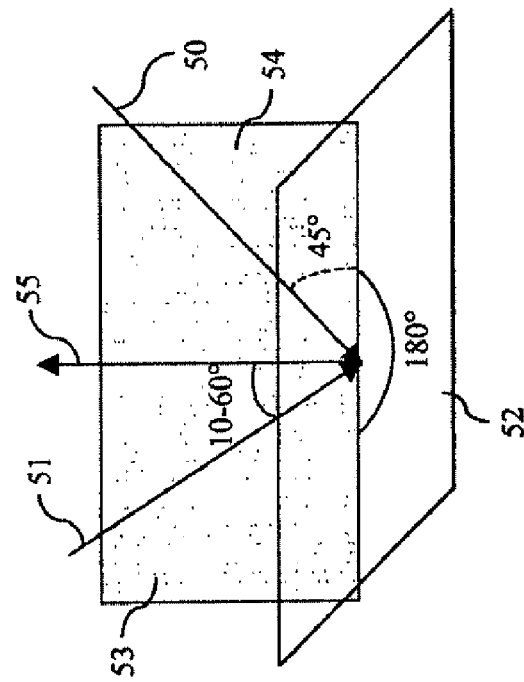
FIG. 7 is an illustration showing a configuration between the ion beam, the deposition flux, and the substrate for the layer-structured material shown in FIG. 6.
Figure 6:
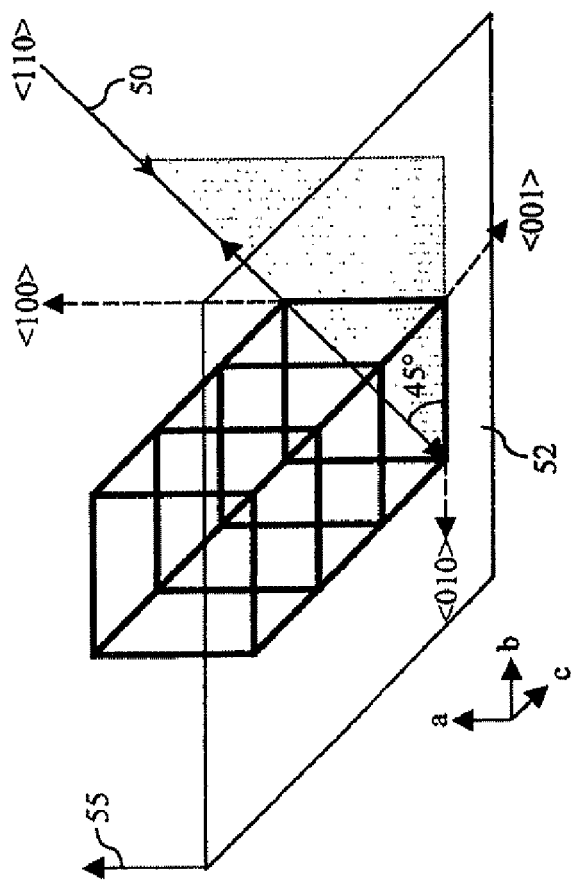
FIG. 6 is an illustration showing a layer-structured material, its crystallographic directions, and the ion beam direction.

In another embodiment, non-cubic, layer-structured materials having strong anisotropic growth rates are used for IBAD biaxially-textured film deposition with an oblique incident deposition flux to achieve a sharp texture. Such materials include, but are not limited to, deformed perovskite structured materials such as $REBa_2Cu_3O_{7-\delta}$ (where RE is one of yttrium, gadolinium, terbium, dysprosium, lanthanum, neodymium, samarium, europium, holmium, erbium, thulium, and/or ytterbium) and rutile type material such as $TiO_2$, $SnO_2$, $WO_2$, $RuO_2$, $MnO_2$, $NbO_2$, $VO_2$, $IrO_2$. FIG. 6 is an illustration showing a layer-structured material, its crystallographic directions, and the ion beam direction. In these embodiments, the growth rate along the a-axis (i.e., the <100> crystal axis) and the b-axis (i.e., the <010> crystal axis) can be several times higher than the growth rate along the c-axis (i.e., the <001> crystal axis). In dynamically-dominating growth, the out-of-plane orientation of the resulting film will be along the a-axis because that is the fast growth direction. The slow growth c-axis, and the other fast growth b-axis, lies in film plane 52. The strong in-plane growth anisotropy between the c-axis and the b-axis will greatly benefit the biaxial texture evolution with the oblique deposition flux. Due to characteristics of the layered structure, the BITD in such materials is parallel to the layer plane (i.e., the a-b plane), as shown in FIG. 6. As shown in FIG. 7, in these embodiments, the ion beam 50 bombards the film 52 at an incident angle of about 45° from substrate normal 55, and the angle between the ion beam incident plane 54 and the deposition flux incident plane 53 is about 0° (or about 180°), or about 90° (or about 270°) in certain growth conditions. The ion beam incident angle 51 is in the range between about 35° and about 60°, preferably 45°, from the substrate normal 55, or substantially along substrate normal (about 0°), or at a glancing angle from substrate surface depending on different material used. The deposition flux incident angle is in the range between about 5° to about 80° from substrate normal. Configuring the ion beam 50, the deposition flux 51, and the substrate 52 in this manner results in the overlapping of the anisotropic growth introduced by the ion beam and the anisotropic growth introduced by the oblique deposition flux to yield fast biaxial texture development. In this embodiment, the deposition rate can be greater than about 1 nm/second, preferably above about 3 nm/second.

The layer-structured material is often a multi-component material. Therefore, in order to get the right composition and stoichiometry during this multi-component deposition, the substrate temperature some times is increased above a value at which the layer-structured composition is stable, preferably the substrate temperature (and corresponding deposition temperature) is about 200° C. to about 600° C. The deposition temperature for obtaining the right composition and stoichiometry of the multi-component material can be determined from phase diagrams. Active oxygen, such as atomic oxygen, ozone, oxygen ions, $N_2O$, etc., may be used to reduce the required deposition temperature.

In all embodiments of the invention, especially in the embodiments of rock salt type material, $REO_3$ type material, perovskite type material and non-cubic, layer-structured material, in order to prevent epitaxial growth from substrate and oxidation of substrate, an intermediate layer is deposited on said substrate before the deposition of said biaxially textured film, if necessary. The function of intermediate layer is achieved by using materials with large lattice mis-match between said intermediate buffer and the said biaxially-textured film, and/or by controlling the grain size of said intermediate buffer layer as small as possible, preferably in nanometer scale. The lattice mis-match is larger than about 10%, preferably larger than about 20%. In order to obtain small grain size the material of said intermediate layer is usually chosen from material with large free energy of formation. Although prior art methods utilize an amorphous layer before deposition for biaxially textured film like IBAD MgO, the intermediate layer utilized herein is not necessary an amorphous layer so that wider range of material with various other properties can be chosen from, and put lower demand on deposition conditions.

Figure 8:
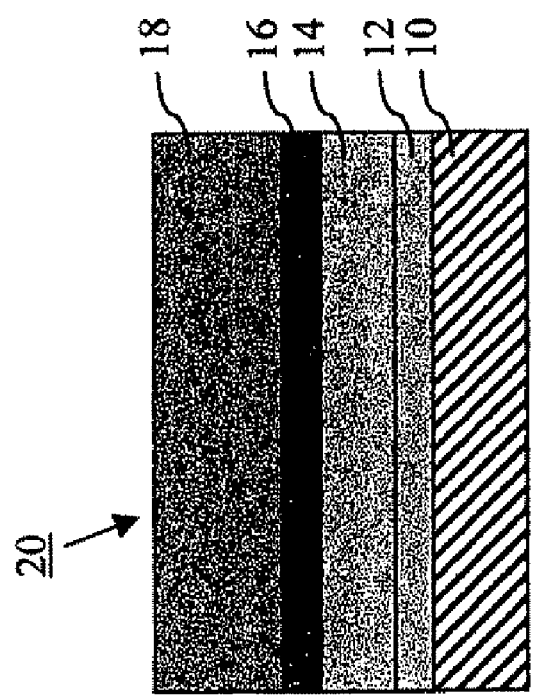
FIG. 8 is an illustration showing a superconducting tape structure that utilizes a layer-structured material to obtain biaxial texture.

Referring now to FIG. 8, there is an illustration showing a superconducting metal substrate such as a tape structure 20 that utilizes a non-cubic layer-structured material to obtain biaxial texture. To prevent epitaxial growth on the substrate 10, and to prevent oxidation of the metal substrate at high temperatures, an intermediate layer 12 (having nanometer grain size and having large lattice mis-match with biaxially textured film) may optionally be deposited on the metal substrate 10 before ion beam assisted deposition of the biaxially-textured film 14. The intermediate layer 12 may comprise rare earth C type materials such as $Y_2O_3$, $Eu_2O_3$, or $Pr_2O_3$; or oxides such as yttrium stabilized zirconium oxide (YSZ); or nitrides such as silicon nitride ($Si_3N_4$). The thickness of this intermediate layer 12 can be about 10 nm to about 300 nm. An epitaxial buffer layer 16 of cubic structured material, having a good lattice match with YBCO, may optionally be deposited on the top of the biaxially-textured film(s) 14, if desired, prior to deposition of the superconducting layer YBCO 18. Some exemplary cubic structured materials 16 comprise $CeO_2$, $SrTiO_3$, $LaMnO_3$, $LaZrO_3$, and/or $GaZrO_3$. High temperature superconducting layer 18 can then be coated on this epitaxial buffer layer 16. Although prior art methods utilize an amorphous layer before deposition for biaxially textured film like IBAD MgO, the intermediate layer utilized herein does not put high demand on the substrate surface roughness, and also does not need additional homo-epitaxial layers.

One exemplary process for creating a biaxially-textured film of a fluorite type material as mentioned above is as follows:

(1.) A metal tape, such as a Ni-based alloy, is electropolished or chemical-mechanically polished to an average roughness of less than about 10 nm.

(2.) Next, a biaxially-textured film of fluorite type material is deposited at a high deposition rate (greater than about 1 nm/s, preferably greater than about 3 nm/s) on the metal tape by a high rate evaporation method, such as e-beam evaporation, with simultaneous ion beam bombardment at an oblique angle of about 45°, from tape normal. The deposition flux is arranged so that it has an oblique incident angle of 25°, from tape normal. The deposition flux incident plane is parallel to the ion beam incident plane. The ion-to-atom arrival ratio is controlled to be around 0.1. The thickness of the biaxially-textured film is about 1500-2000 nm.

(3.) Thereafter, a thin epitaxial buffer film (less than about 100 nm) is deposited onto the biaxially-textured film. Depending on the material used for the biaxially-textured film, the thin, epitaxial film may be omitted, if desired. The material of the epitaxial buffer layer may comprise, but is not limited to, cerium oxide ($CeO_2$) and/or strontium titanate ($SrTiO_3$).

(4.) Finally, a YBCO layer with a thickness greater than about 1000 nm is grown on the buffer layer structure. Therefore the buffer layer structure may consist of the required biaxially-textured film and the optional epitaxial film.

The high temperature superconductors of this invention generally comprise at least: a substrate, a biaxially-textured film by the methods described in this invention, in claim 1, claim 41, claim 53, claim 66, and a superconducting layer. In various embodiments of the present invention, the substrate may include, but is not limited to, any polycrystalline metal or metal alloy such as nickel alloy and the like. Nickel alloy may be preferred due to its high strength and temperature-resistant properties. During the deposition of the superconducting layer, it is necessary to achieve temperatures of about 800° C.

Various alloys, such as Hastelloy® (Ni—Cr—Mo alloy) and Inconel® (Ni—Cr—V alloy), are resistant to oxygen and are suitable for use in the present invention. The metal substrate, on which the biaxially-textured film is deposited, should preferably provide flexibility to the whole structure so that the structure may be shaped and wound in the form of a tape, cable or coil for all electric power applications. The metal substrate should be as thin, preferably less than about 0.15 mm, and flexible as possible.

As previously discussed, the biaxially-textured film may comprise any suitable material that does not adversely react with the superconducting layer or the substrate. The materials used for these biaxially-textured film(s) have a fast growth rate along certain low index crystallographic directions, and a slow growth rate along the other crystallographic directions. An ion beam can be used to bombard the growing film simultaneously under various configuration of ion beam, deposition flux and substrate normal; this configuration is depended on the materials and deposition conditions used. The materials used for these biaxially textured films may comprise, but are not limited to, fluorite type materials such as cerium oxide ($CeO_2$) and yttria-stabilized zirconia (YSZ); pyrochlore type materials such as $Eu_2Zr_2O_7$ and $Gd_2Zr_2O_7$; and rare-earth C type materials such as yttrium oxide ($Y_2O_3$), rock salt type material, $ReO_3$ type material, perovskite type material, non-cubic material with strong anisotropic growth rate. The biaxially-textured films may be applied by any of a variety of conventional methods, using at least one of evaporation method including resistive heating evaporation, co-evaporation, electron beam evaporation, magnetron sputtering, pulsed laser ablation, ion beam sputtering, molecular beam epitaxy.

A superconducting layer may be subsequently deposited upon the buffer layer structure. The superconducting layer may be applied by any of a variety of conventional methods including, but not limited to, evaporation including co-evaporation, electron beam evaporation, sputtering including magnetron sputtering, ion beam sputtering and ion assisted sputtering, chemical vapor deposition, metal organic chemical vapor deposition, plasma enhanced chemical vapor deposition, molecular beam epitaxy, a sol-gel process, a solution process, and/or liquid phase epitaxy.

Suitable examples of superconductor materials include, but are not limited to, oxide superconductor materials, such as yttrium barium copper oxides ($YBa_2Cu_3O_{7-\delta}$), rare-earth barium copper oxides, and mixtures of the two materials. In the case of rare-earth barium copper oxides, the yttrium of YBCO may be partially or completely replaced by rare-earth metals from the periodic table such as, but not limited to, gadolinium, terbium, dysprosium, lanthanum, neodymium, samarium, europium, holmium, erbium, thulium and ytterbium. The superconducting material is preferably YBCO, although other minor variations of this basic superconducting material may be used. The superconducting layer may have a general thickness in the range of about 1.0 μm to about 20.0 μm, more preferably in the range of about 1.0 μm to about 10.0 μm. The thickness of the superconducting layer may vary for selected applications.

Figure 9:
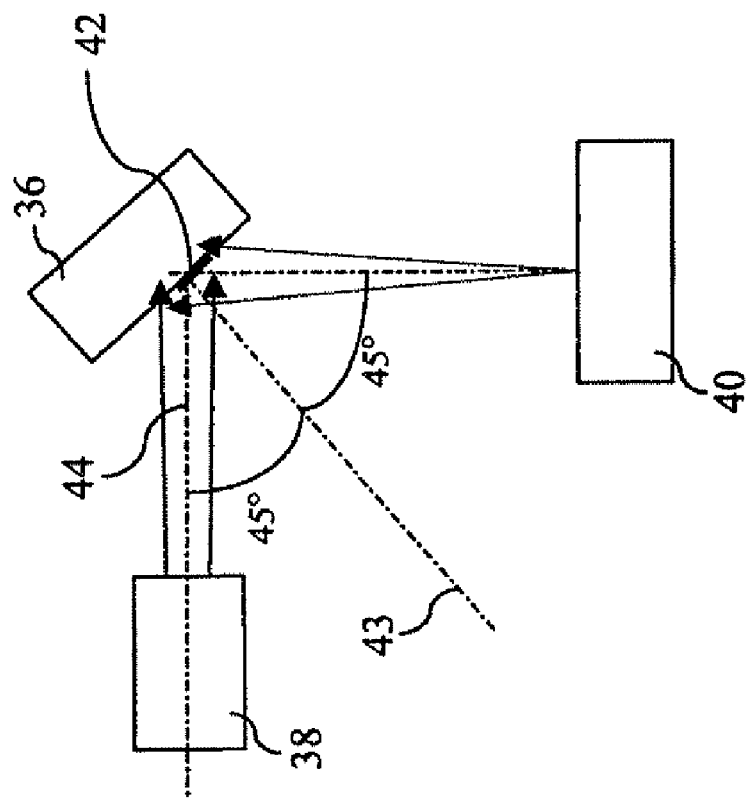
FIG. 9 is an illustration showing an exemplary fast IBAD system for depositing a biaxially-textured film with an oblique incident angle deposition flux.
Figure 10:
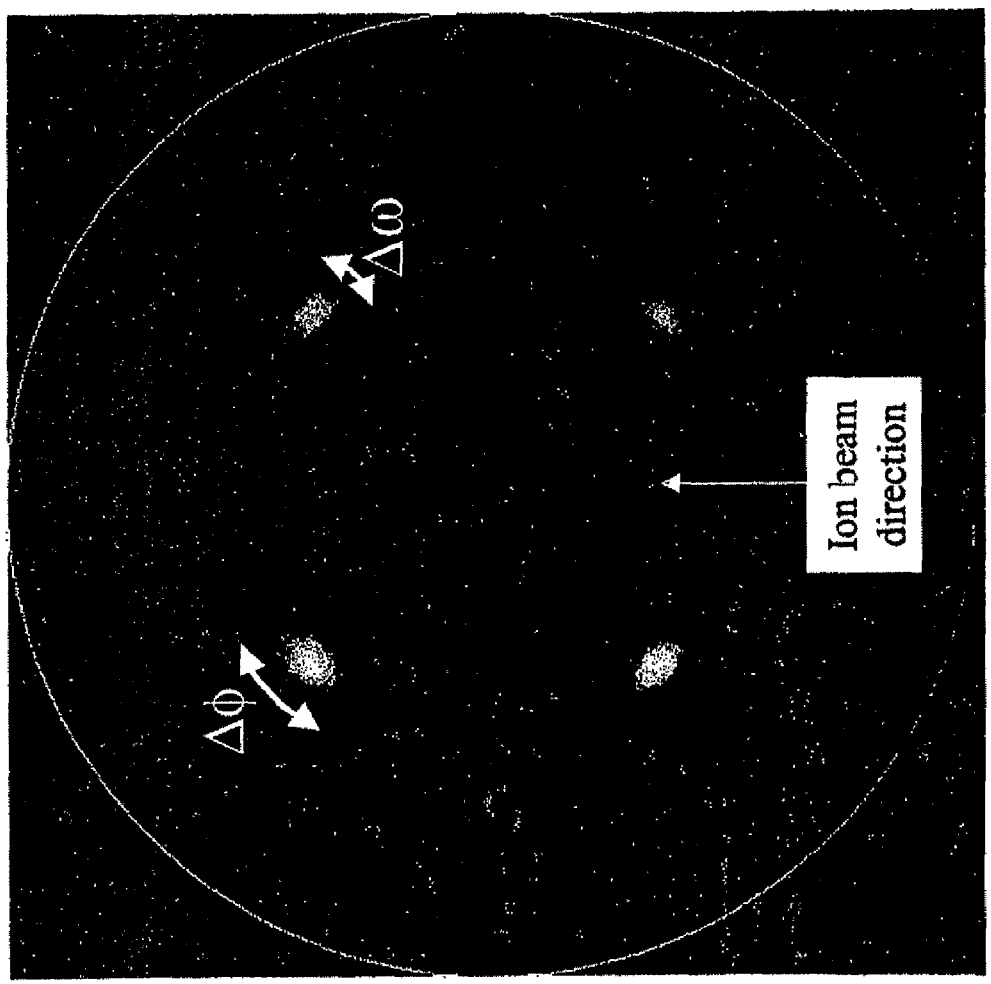
FIG. 10 is an illustration showing the pole figure for a biaxially textured film deposited using the methods of this invention.

FIG. 9 is an example of a Fast IBAD System with Oblique Deposition Flux (FIBAD/ODF). A 6×66 cm RF ion gun 38 was installed in a vacuum system with a base pressure better than $5 \times 10^{-6}$ Torr, which bombards the tape 42 at an incident angle of about 45° between the ion beam 44 and tape normal 43. Argon was used in the ion gun and neutralizer. Oxygen, preferably active oxygen, was provided near the tape 42. The working pressure was about $1.4 \times 10^{-4}$ Torr. Normal ion energy was about 760 eV. The ion current density at the tape position was about 0.52 mA/cm². The deposition zone, defined by an aperture, was about 8.8 cm by about 60 cm. Three rod-feed electronic beam evaporating sources 40, lined up along a long direction of the deposition zone, provided a uniform $CeO_2$ deposition rate about 4.1 nm/s at the tape deposition zone. The ion to atom ratio is about 0.13. The tape holder 36 was tilted by about 45°, so the e-beam deposition flux had approximately a 45° oblique angle to the tape normal 43. The tape 42 was electropolished or chemical-mechanically polished to an average roughness of less than about 10 nm. The tape 42 continuously moved in a direction normal to the paper of the drawing, perpendicular to both the ion beam 44 and the deposition flux. The tape 42 had good contact with the tape holder 36, and could either be water-cooled or heated by the tape holder. The deposition flux, ion beam and tape normal were all in the same plane. The biaxially-textured film was deposited to a thickness of about 1,800 nm while moving through the deposition zone, either in a single pass or in multiple passes. The resulting film had its <002> crystal axis along tape normal, and its <020> crystal axis in the ion beam incident plane. The FWHM of phi-scan of biaxially texture film was about 11°, as shown in FIG. 10, providing a good template for the epitaxial growth of a superconducting layer, a layer resulting in a critical current density greater than about 1 MA/cm².

The superconductor article may be employed in a power cable. In one embodiment, the power cable may comprise a plurality of superconductive tapes, wherein each tape comprises a substrate; a biaxially-textured film produced by the methods described in present invention; and a superconducting layer. In a further embodiment, the power cable may comprise a conduit for the passage of a coolant fluid, and the superconductive tapes may be wrapped around the conduit.

The superconductor article may be employed in a power transformer. In one embodiment, the power transformer may comprise a plurality of windings, wherein each winding comprises a wound coil of superconductive tape, wherein each tape comprises a substrate; a biaxially-textured film produced by the methods described in this invention; and a superconducting layer.

The superconductor article may be employed in a power generator. In one embodiment, the power generator may comprise a shaft coupled to a rotor comprising electromagnets comprising at least one rotor coil, and a stator comprising a conductive winding surrounding the rotor, wherein at least one of the winding and the at least one rotor coil comprises a superconductive tape. As above, each superconductive tape comprises a substrate; a biaxially-textured film produced by the methods described in this invention; and a superconducting layer.

The superconductor article may be used in a power grid. In one embodiment, the power grid may comprise a power generation station comprising a power generator, a transmission substation comprising a plurality of power transformers, at least one power transmission cable, a power substation, and at least one power distribution cable. The plurality of transformers are operable for receiving power from the power generation station and stepping-up voltage for transmission. The power transmission cables are operable for transmitting power from the transmission substation. The power substation is operable for receiving power from the power transmission cables, and comprises a plurality of power transformers for stepping-down voltage for distribution. The at least one power distribution cable is operable for distributing power to an end user. The power transmission cables, power distribution cables, transformers of the power substation, transformers of the transmission substation, and the power generator may comprise a plurality of superconductive tapes. Each superconductive tape comprises a substrate; a in biaxially-textured film produced by the methods described this invention; and a superconducting layer.

The foregoing is a description of some preferred embodiments of this invention, which are given here by way of example only. Although the biaxially-textured film deposition methods of the present invention have been described with reference to preferred embodiments and examples thereof, other embodiments and examples may perform similar functions and/or achieve similar results. All such equivalent embodiments and examples are within the spirit and scope of the present invention and are intended to be covered by the following claims.

What is claimed is:

1. A method for depositing a biaxially textured film on a substrate, comprising:
    depositing a film on a substrate with a deposition flux at an oblique incident angle, while simultaneously bombarding said deposited film using an ion beam at an ion beam incident angle arranged along either a best ion texture direction (BITD) or a second best ion texture direction of said film, thereby forming a biaxially-textured film,
    wherein a deposition flux incident plane is arranged parallel to a direction along which said biaxially-textured film has the fastest in-plane growth rate and an angle between said deposition flux incident plane and an ion beam incident plane is about 45° or about 135°.
2. The method of claim 1, wherein said ion beam incident angle is in the range between about 10° and about 60° from film normal.
3. The method of claim 1, wherein said deposition flux incident angle is in the range between about 5° and about 80° from film normal.
4. The method of claim 1, wherein the deposition rate is above about 1 nm/second.
5. The method of claim 4, wherein said deposition rate is above about 3 nm/second.
6. The method of claim 1, wherein normal ion energy of said ion beam is in the range between about 150 eV and about 1500 eV.
7. The method of claim 1, wherein said biaxially-textured film comprises a cubic-structured material having said fastest growth rate direction along at least one of the crystal axes <100>, <010>, or <001>.
8. The method of claim 7, wherein the said biaxially-textured film comprises a material with a best ion texture direction (BITD) or a second best ion texture direction along <111> crystal direction.
9. The method of claim 8, wherein said material comprises at least one of: a fluorite type material, a pyrochlore type material, and a rare-earth C type material.
10. The method of claim 9, wherein said fluorite type material comprises at least one of cerium oxide ($CeO_2$), RE doped cerium oxide $(RECe)O_2$, where RE is samarium, europium, erbium, lanthanum), yttria-stabilized zirconia (YSZ); wherein said pyrochlore type material comprises at least one of $Eu_2Zr_2O_7$ or $Gd_2Zr_2O_7$; and wherein said rare-earth C type material comprises yttrium oxide ($Y_2O_3$).
11. The method of claim 8, wherein said ion beam incident angle is about 55° from film normal.
12. The method of claim 8, wherein said deposition flux incident angle is in the range between about 20° and about 55° from film normal.
13. The method of claim 8, wherein said biaxially-textured film thickness is above about 0.2 μm.
14. The method of claim 1, wherein said biaxially-textured film comprises a cubic-structured material having said fastest growth rate direction along crystal axis <111>.
15. The method of claim 14, wherein the said biaxially-textured film comprises of a material with a best ion texture direction (BITD) or a second best ion texture direction along <110> crystal direction.
16. The method of claim 15, wherein said material comprises at least one of: a rock salt type material, a $ReO_3$ type material, and a perovskite type material.
17. The method of claim 16, wherein said material of said biaxially-textured film comprises at least one of magnesium oxide (MgO), nickel oxide (NiO), tungsten trioxide ($WO_3$), barium oxide (BaO), lanthanum aluminate ($LaAlO_3$), and strontium titanate ($SrTiO_3$).
18. The method of claim 15, wherein said ion beam incident angle is about 45° from film normal.
19. The method of claim 15, wherein said deposition flux incident angle is in the range between about 45° and about 65° from film normal.
20. The method of claim 1, wherein an intermediate layer is deposited between said substrate and said biaxially-textured film.
21. The method of claim 20, wherein the grain size of said intermediate layer is in nanometer scale.
22. The method of claim 20, wherein the lattice mismatch between said intermediate layer and said biaxially-textured film is larger than about 10%.
23. The method of claim 20, wherein said intermediate layer comprises at least one of rare earth C types material, oxides, and nitrides.
24. The method of claim 1, wherein said deposition flux is provided using at least one of evaporation method including resistive heating evaporation, co-evaporation, electron beam evaporation, magnetron sputtering, pulsed laser ablation, ion beam sputtering.
25. A method for depositing a biaxally textured film on a substrate, comprising:
    depositing a film on a substrate with a deposition flux at an oblique incident angle, while simultaneously bombarding said deposited film using an ion beam at an ion beam incident angle arranged along either a best ion texture direction (BITD) or a second best ion texture direction of said film, thereby forming a biaxially-textured film,
    wherein a deposition flux incident plane is arranged parallel to a direction along which said biaxially-textured film has the fastest in-plane growth rate and an angle between said deposition flux incident plane and an ion beam incident plane is about 90°.
26. The method of claim 25, wherein an ion to atom arrival ratio is less than about 0.5.
27. The method of claim 26, wherein said ion to atom arrival ratio is in the range between about 0.05 and about 0.3.
28. The method of claim 25, wherein said biaxially-textured film comprises a cubic-structured material having said fastest growth rate direction along at least one of the crystal axes <100>, <010>, or <001>.
29. The method of claim 28, wherein the said biaxially-textured film comprises a material with a best ion texture direction (BITD) or a second best ion texture direction along <110> crystal direction.
30. The method of claim 29, wherein said material comprises at least one of: a fluorite type material, a pyrochlore type material, and a rare-earth C type material.
31. The method of claim 30, wherein said fluorite type material comprises at least one of cerium oxide ($CeO_2$), RE doped cerium oxide $(RECe)O_2$, where RE is samarium, europium, erbium, lanthanum), yttria-stabilized zirconia (YSZ); wherein said pyrochlore type material comprises at least one of $Eu_2Zr_2O_7$ or $Gd_2Zr_2O_7$; and wherein said rare-earth C type material comprises yttrium oxide ($Y_2O_3$).

32. The method of claim 29, wherein said ion beam incident angle is about 45° from film normal.

33. The method of claim 29, wherein said deposition flux incident angle is in the range between about 20° and about 55° from film normal.

34. The method of claim 25, wherein said ion beam incident angle is in the range between about 10° and about 60° from film normal.

35. The method of claim 25, wherein said deposition flux incident angle is in the range between about 5° and about 80° from film normal.

36. The method of claim 25, wherein the deposition rate is above about 1 nm/second.

37. The method of claim 36, wherein said deposition rate is above about 3 nm/second.

38. The method of claim 25, wherein normal ion energy of said ion beam is in the range between about 150 eV and about 1500 eV.

39. The method of claim 38, wherein normal ion energy of said ion beam is in the range between about 500 eV and about 900 eV.

40. The method of claim 29, wherein said biaxially-textured film thickness is above about 0.2 µm.

41. A method for depositing a biaxially textured film on a substrate, comprising:
depositing a film on a substrate with a deposition flux at an oblique incident angle, while simultaneously bombarding said deposited film using an ion beam, thereby forming a biaxially-textured film, wherein said ion beam is substantially parallel to substrate normal.

42. The method of claim 41, wherein said deposition flux incident angle is in the range between about 5° to about 80° from film normal.

43. The method of claim 42, wherein said deposition flux incident angle is in the range between about 45° to about 65° from film normal.

44. The method of claim 41, wherein a material comprises at least one of: a rock salt type material, a $ReO_3$ type material, and a perovskite type material.

45. The method of claim 44, wherein said material comprises at least one of magnesium oxide (MgO), nickel oxide (NiO), tungsten trioxide ($WO_3$), barium oxide (BaO), lanthanum aluminate ($LaAlO_3$), and strontium titanate ($SrTiO_3$).

46. The method of claim 41 wherein said biaxially-textured film has <001> crystal direction substantially parallel to the substrate normal.

47. The method of claim 41, wherein the deposition rate is above about 1 nm/second.

48. The method of claim 47, wherein said deposition rate is above about 3 nm/second.

49. The method of claim 41, wherein normal ion energy of said ion beam is in the range between about 300 eV and about 1500 eV.

50. The method of claim 41, wherein an intermediate layer is deposited between said substrate and said biaxially-textured film.

51. The method of claim 50, wherein the grain size of said intermediate layer is in nanometer scale.

52. The method of claim 50, wherein the lattice mismatch between said intermediate layer and said biaxially-textured film is larger than about 10%.

53. The method of claim 50, wherein said intermediate layer comprises at least one rare earth C types material, oxides, and nitrides.

54. The method of claim 41, wherein said deposition flux is provided using at least one of evaporation method including resistive heating evaporation, co-evaporation, electron beam evaporation, magnetron sputtering, pulsed laser ablation, ion beam sputtering.

55. A method for depositing a biaxially textured film on a substrate, comprising:
depositing a film on a substrate with a deposition flux at an oblique incident angle, while simultaneously bombarding said deposited film using an ion beam, thereby forming a biaxially-textured film, wherein an ion beam incident angle is at a glancing angle along substrate surface.

56. The method of claim 55, wherein an angle between said deposition flux incident plane and an ion beam incident plane is about 45° or about 135°.

57. The method of claim 55, wherein a material comprises at least one of a rock salt type material, a $ReO_3$ type material, and a perovskite type material.

58. The method of claim 57, wherein said material comprises at least one of magnesium oxide (MgO), nickel oxide (NiO), tungsten trioxide ($WO_3$), barium oxide (BaO), lanthanum aluminate ($LaAlO_3$), and strontium titanate ($SrTiO_3$).

59. The method of claim 55, wherein said deposition flux incident angle is in the range between about 5° to about 80° from film normal.

60. The method of claim 59, wherein said deposition flux incident angle is in the range between about 45° to about 65° from film normal.

61. The method of claim 55, wherein normal ion energy of said ion beam is in the range between about 300 eV and about 1500 eV.

62. The method of claim 61, wherein normal ion energy of said ion beam is in the range between about 700 eV and about 900 eV.

63. The method of claim 55, wherein an intermediate layer is deposited between said substrate and said biaxially-textured film.

64. The method of claim 63, wherein the grain size of said intermediate layer is in nanometer scale.

65. The method of claim 63, wherein the lattice mismatch between said intermediate layer and said biaxially-textured film is larger than about 10%.

66. The method of claim 63, wherein said intermediate layer comprises at least one rare earth C types material, oxides, and nitrides.

67. The method of claim 55, wherein said deposition flux is provided using at least one of evaporation method including resistive heating evaporation, co-evaporation, electron beam evaporation, magnetron sputtering, pulsed laser ablation, ion beam sputtering.

68. A method for depositing a biaxially textured film on a substrate, comprising: depositing a film on a substrate with a deposition flux at an oblique incident angle, while an assisting ion beam bombards said deposited film simultaneously during deposition, thereby forming a biaxially-textured film having a c-axis substantially parallel to a surface of the film,
wherein said biaxially-textured film comprises a non-cubic layer-structured material with strong anisotropic growth rate along an a-b plane, wherein said growth rate along said a-b plane is much higher than along a c-axis.

69. The method of claim 68, wherein said biaxially-textured film is grown under dynamical growth conditions so that said film has said a-b plane substantially parallel to substrate normal and said c-axis of said film lies on said substrate, wherein said ion beam incident plane is substantially parallel to said a-b plane.

70. The method of claim 69, wherein said ion beam incident angle from substrate normal is in the range between about 10° and about 60°.

71. The method of claim 70, wherein said ion beam incident angle is about 45° from substrate normal.

72. The method of claim 69, wherein said ion beam incident angle is a glancing angle along said substrate surface.

73. The method of claim 69, wherein said ion beam incident angle is substantially along substrate normal.

74. The method of claim 69, wherein said deposition flux incident angle is in the range between about 5° and about 80° from film normal.

75. The method of claim 69, wherein said angle between the ion beam incident plane and said deposition flux incident plane is about 0° or about 180° or about 90° or about 270°.

76. The method of claim 69, wherein said non-cubic layer-structured material comprises at least one deformed perovskite structured material or a rutile type material.

77. The method of claim 76, wherein said deformed perovskite structured material comprises $REBa_2Cu_3O_{7-\delta}$ where RE comprises at least one of yttrium, gadolinium, terbium, dysprosium, lanthanum, neodymium, samarium, europium, holmium, erbium, thulium, and ytterbium; and said rutile type material comprises at least one of $TiO_2$, $SnO_2$, $WO_2$, $RuO_2$, $MnO_2$, $NbO_2$, $VO_2$, $IrO_2$.

78. The method of claim 69, wherein the deposition rate is greater than about 1 nm/second.

79. The method of claim 78, wherein said deposition rate is above about 3 nm/second.

80. The method of claim 69, wherein a deposition temperature is sufficient to obtain the desired composition and stoichiometry of said non-cubic, layer-structured material.

81. The method of claim 80, wherein active oxygen is disposed substantially on said biaxially textured film during deposition to reduce said deposition temperature.

82. The method of claim 81, wherein said active oxygen comprises at least one of atomic oxygen, ozone, oxygen ions, or $N_2O$.

83. The method of claim 69, wherein an intermediate layer is deposited between said substrate and said biaxially textured film.

84. The method of claim 83, wherein the grain size of said intermediate layer is in nanometer scale.

85. The method of claim 83, wherein the lattice mis-match between said intermediate buffer and said biaxially-textured film is larger than about 10%.

86. The method of claim 83, wherein said intermediate layer comprises at least one rare earth C types material, oxides, and nitrides.

87. The method of claim 68, wherein said deposition flux is provided using at least one of evaporation method including resistive heating evaporation, co-evaporation, electron beam evaporation, magnetron sputtering, pulsed laser ablation, ion beam sputtering.

* * * * *